(12) United States Patent
Xu et al.

(10) Patent No.: US 6,680,436 B2
(45) Date of Patent: Jan. 20, 2004

(54) REFLOW ENCAPSULANT

(75) Inventors: Antai Xu, San Jose, CA (US); Robert Michael Echols, Yukon, OK (US); Eng Siong David Yeh, Singapore (SG); Michael John Peterson, Prior Lake, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 225 days.

(21) Appl. No.: 09/821,549

(22) Filed: Mar. 29, 2001

(65) Prior Publication Data

US 2002/0046860 A1 Apr. 25, 2002

Related U.S. Application Data

(60) Provisional application No. 60/218,029, filed on Jul. 12, 2000.

(51) Int. Cl.$^7$ ................................................. H01L 23/28
(52) U.S. Cl. ...................... 174/52.2; 361/760; 361/762; 257/789
(58) Field of Search ............................... 174/52.2, 52.3, 174/52.4; 361/760, 762, 764; 257/737, 738, 778, 787, 788, 789, 795

(56) References Cited

U.S. PATENT DOCUMENTS

| | | | |
|---|---|---|---|
| 5,128,746 A | | 7/1992 | Pennisi et al. |
| 5,543,585 A | | 8/1996 | Booth et al. |
| 5,760,337 A | | 6/1998 | Iyer et al. |
| 5,814,401 A | | 9/1998 | Gamota et al. |
| 5,821,456 A | * | 10/1998 | Wille et al. ................ 174/52.2 |
| 5,985,456 A | | 11/1999 | Zhou et al. |
| 5,998,876 A | | 12/1999 | Carter et al. |
| 6,034,333 A | * | 3/2000 | Skipor et al. ............... 174/260 |
| 6,071,371 A | | 6/2000 | Leonard et al. |
| 6,111,323 A | | 8/2000 | Carter et al. |
| 6,114,627 A | | 9/2000 | Moden |
| 6,121,358 A | | 9/2000 | Dershem et al. |
| 6,121,689 A | | 9/2000 | Capote et al. |
| 6,255,738 B1 | * | 7/2001 | Distefano et al. ........... 257/783 |
| 6,324,069 B1 | * | 11/2001 | Weber ....................... 361/783 |

\* cited by examiner

*Primary Examiner*—Dean A. Reichard
*Assistant Examiner*—Carmelo Oliva
(74) *Attorney, Agent, or Firm*—Derek J. Berger

(57) ABSTRACT

A reflow encapsulant is used with substrate and an electronic device. The encapsulant is configured to cure when the assembly is heated so as to reflow solder bumps connecting the substrate and electronic device. The encapsulant includes inorganic filler in an amount of 8% to 20% by weight. The amount of filler provided is sufficiently high to lower the CTE of the encapsulant so as to enhance cured material properties and prevent undue expansion and solder joint damage, but low enough so that the solder joints are not affected by filler particles during reflow.

10 Claims, 2 Drawing Sheets

REFLOW ENCAPSULANT

CROSS REFERENCE TO RELATED APPLICATIONS

This application claims the benefit of U.S. Provisional Application No. 60/218,029, filed Jul. 12, 2000.

FIELD OF THE INVENTION

This invention relates generally to electronic circuitry, and more particularly, but not by way of limitation, to encapsulants for maintaining the electrical and mechanical integrity of solder connections between electronic devices and substrates.

BACKGROUND OF THE INVENTION

Integrated circuit chips (ICs) for controlling electronic devices are currently cut from silicon wafers and packaged so that they can be electrically attached to circuitry of a substrate, such as a printed circuit board (PCB) or printed circuit cable (PCC).

IC packages have been known to take many forms. One example of a well-known IC package is the "flip chip", in which an IC, or "die", has numerous electrical leads which are typically connected to solder balls, also known as solder "bumps" on a surface of the die. The die is then inverted so the solder balls face the substrate, which is provided with contact pads on its upper surface. The solder balls on the die and the pads on the substrate are arranged so as to align with one another when the die is properly positioned on the substrate. After the die is placed on the substrate such that the solder bumps are in contact with the pads of the substrate, the assembly is heated so the solder is caused to reflow (i.e., liquefy). Upon cooling, the reflowed solder hardens, thereby forming structural solder joints. These joints electrically connect the die and substrate, and also provide overall structural support for the die-substrate assembly. A narrow gap is left between the die and the substrate.

It is desirable to provide reinforcement to the solder joints so they do not break under conditions such as vibration or thermal shock. One method for enhancing the reliability of the die-substrate assembly is to dispense an encapsulant in the gap between the die and the substrate. Encapsulants are known to take different forms including those of silicone, epoxy, or other organic resin systems. Of these families of materials, curable resins, i.e., resins that require a curing process after dispensing, are desirable because of their distinct physical properties before and after the curing or crosslinking process. Prior to curing, they are fluid so they can easily be dispensed into the chip-substrate gap so as to cover all exposed surfaces. After curing, they exhibit toughness, adhesion, and solvent resistance. The encapsulant is therefore able to provide enhanced reliability to the assembly by distributing mechanical stresses away from the solder bumps and also by encapsulating the solder bump interconnection so that they are not subject to environmental degradation. To a resin system determines the cured properties of the material, Generally, cured epoxy resins provide hardness and adhesion strength in most applications, but may exhibit a tendency to crack during thermal stressing. Silicones, on the other hand, are Less brittle than epoxies and are therefore less prone to fracturing under physical stress, but are also less rigid.

Traditionally, encapsulants have been introduced into the die-substrate gap by capillary flow underfill, a process which takes place after the solder joints have been wetted, heated to achieve reflow, and cooled. Underfill is accomplished by dispensing the resin about the perimeter of the gap and allowing capillary action to draw the resin into it. The assembly is then heated to a temperature sufficient to crosslink the resin to form the cured encapsulant.

While capillary flow underfill is an effective method by which to structurally reinforce solder joints, it requires a large number of manufacturing steps. These steps include: (1) fluxing the solder bumps on the die; (2) placing the die on the substrate; (3) heating to reflow the solder; (4) allowing the solder joints to cool; (5) reheating the substrate to the desired temperature to achieve proper flow of the underfill under the die; (6) introducing the encapsulant between the die and substrate; (7) heating the assembly again to cure the encapsulant; and finally, (8) allowing the assembly to cool once again. Performing all of these steps is both time-consuming and costly.

Reflow encapsulants have been introduced in recent years in an attempt to reduce the number of manufacturing steps associated with underfill encapsulation. Reflow encapsulants are similar to underfill encapsulants in that they are composed of a curable components, but differ in that one or more of the formulation components acts as a fluxing agent for the solder balls. Wetting of the solder bumps can then be accomplished by introducing the reflow encapsulant to the solder pads, eliminating the need for a separate fluxing step. In addition, reflow and curing can be accomplished together in one heating step, thereby eliminating the need for two separate heating steps. Assembly using a reflow encapsulant requires only the following steps: (1) applying the encapsulant to substrate or the chip; (2) placing the chip on the substrate; and (3) heating the assembly so as to both reflow the solder and cure the encapsulant. Use of a reflow encapsulant is clearly more efficient than underfill encapsulation in terms of both time and cost as a result of the elimination of one of the heating steps and the wetting step.

However, reflow encapsulants raise another set of problems. An epoxy formulation used for encapsulation typically has a coefficient of thermal expansion (CTE) significantly higher than that of a typical substrate material. Device failure can result when changes in temperature cause the substrate and encapsulant to expand at different rates. For this reason, it has been common to lower the CTE of the encapsulant by adding inorganic filler material to the epoxy formulation, typically in an amount of 50% to 70% by weight. This is satisfactory in the case of underfill encapsulation, where solder joints have already been formed upon introduction of the encapsulant. However, reflow encapsulant is introduced before solder joint reflow, and this raises the possibility that filler material in the encapsulant will prevent or hinder proper solder wetting during reflow. Improper solder wetting or flow can electrically and mechanically impair the integrity of the solder joints connecting the die and substrate.

What the prior art has been lacking is a reflow encapsulant which maintains the integrity of solder joints during reflow but which also does not lead to device failure as a result of temperature change.

SUMMARY OF THE INVENTION

Disclosed is a reflow encapsulant for use with a substrate and an electronic device. The encapsulant is configured to cure when the assembly is heated so as to reflow solder bumps connecting the substrate and electronic device. The encapsulant includes inorganic filler in an amount of 8% to 20% by weight. The amount of filler provided is sufficiently high to lower the CTE of the encapsulant so as to enhance cured material properties and prevent undue expansion and solder joint damage, but low enough so that the solder joints are not affected by filler particles during reflow.

These and various other features and advantages which characterize the present invention will be apparent from a reading of the following detailed description and a review of the associated drawings.

DETAILED DESCRIPTION OF THE INVENTION

Figure 1:
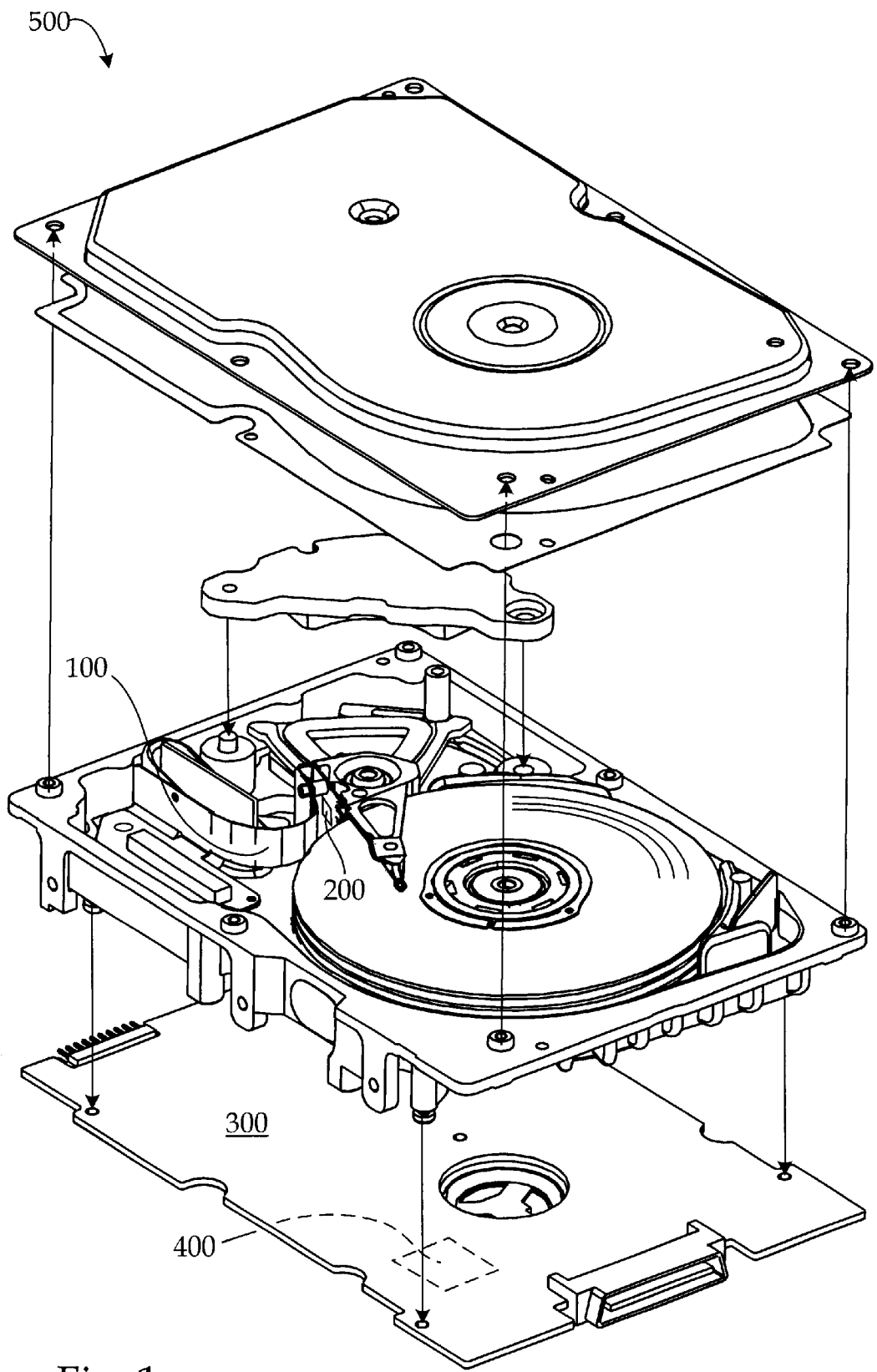
FIG. 1 shows an exploded view of an electronic device utilizing a printed circuit board.

Turning now to the drawings and specifically to FIG. 1, shown is an exploded view of an example of an electronic apparatus 500 in which the present invention is particularly useful. The electronic apparatus 500 is controlled in part by a variety of substrate-mounted electrical components. For example, component 200 is mounted on and electrically connected to a printed circuit cable (PCC) 100, while component 400 is mounted on and electrically connected to a printed circuit board (PCB) 300. These substrates are in turn electrically connected to apparatus 500.

Figure 2:
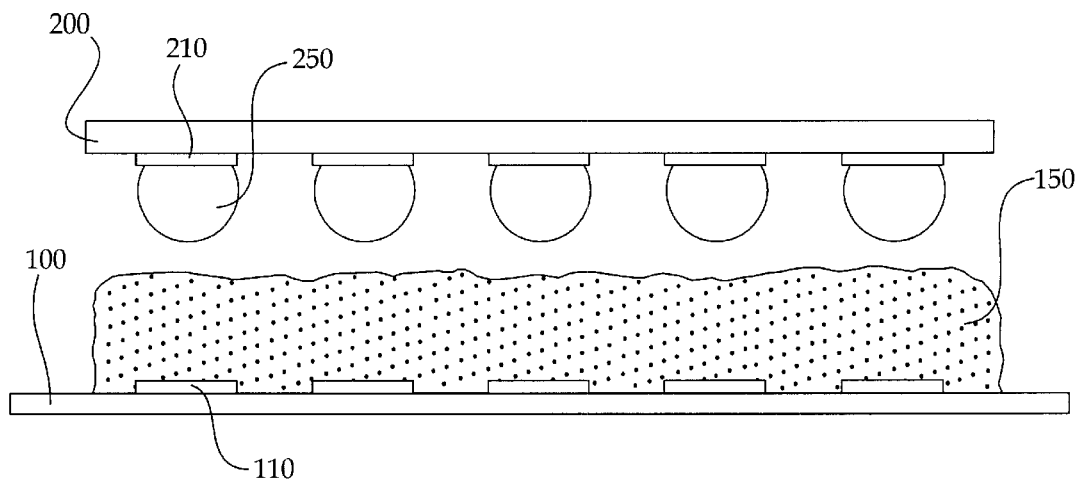
FIG. 2 depicts a cross-sectional view of a die and substrate prior to assembly.

FIG. 2 shows a cross-sectional view of a component 200, shown here as an integrated circuit chip, prior to being mounted to substrate 100, shown in this embodiment to take the form of a Printed Circuit Card Assembly (PCCA). The upper surface of substrate 100 includes contacts 110 which are electrically connected to electrical circuitry in the substrate. Die 200 includes contacts 210 on its lower surface which are electrically connected to the circuitry of the die. Solder bumps 250 are shown to have been deposited on the die contacts 210, and are positioned so as to correspond to the locations of the substrate contacts 110, although it should be understood that the bumps 250 could have been deposited on the substrate contacts 110 instead. Before the die 200 is brought into contact with the substrate 100, an uncured encapsulant 150 is applied. While FIG. 2 shows the encapsulant 150 to be applied to the substrate 100, it should be understood that the encapsulant 150 could instead be applied to the lower surface of the die 200, or to both the die 200 and substrate 100.

Figure 3:
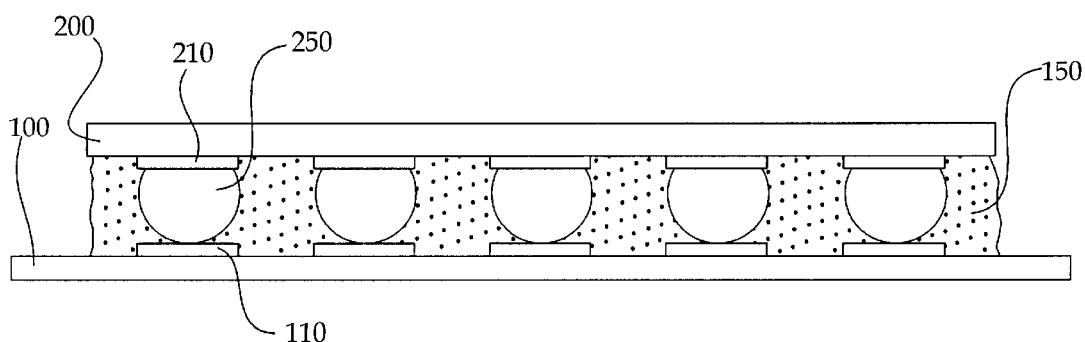
FIG. 3 depicts a cross-sectional view of a die and substrate after placement of the die upon the substrate.

FIG. 3 shows the die-substrate assembly after the die 200 has been placed in contact with the substrate 100 in preparation for entry into the reflow/curing stage. Note that solder bumps 250 are in physical contact with substrate contacts 110. At this point in the process, the encapsulant 150 remains fluid and the solder bumps 250 are not bonded to substrate contacts 110. Encapsulant 150 includes one or more hardener or flow agent components which act to provide proper wetting of the solder bumps 250 upon introduction of the encapsulant 150 between the die 200 and substrate 100. This also ensures that all exposed surfaces of the solder bumps 250 are completely and thoroughly wetted when the die 200 placed in position on the substrate 100.

Figure 4:
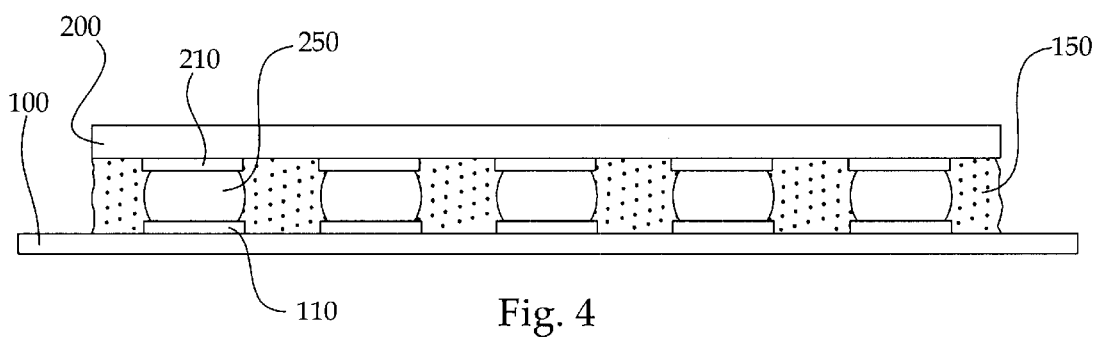
FIG. 4 depicts a cross-sectional view of a die and substrate after reflow and cure.

FIG. 4 depicts the die-substrate assembly after it has been heated for solder reflow and curing of the encapsulant. Sufficiently heating the assembly causes solder bumps 250 to reflow, so as to form electromechanical bonds with substrate contacts 110 when the solder resolidifies upon cooling. At the same time, heating the assembly activates the curing agent within the encapsulant 150, causing encapsulant 150 to harden around the solder connections 150 between die 200 and substrate 100. Encapsulant 150 serves to protect the area between the die 200 and substrate 100 from contaminants, and also provides structural reinforcement to prevent device failure which might result from extreme conditions such as mechanical shock.

Substrate materials typically have a coefficient of thermal expansion (CTE) of less than 20 parts per million (ppm). The CTE of a typical cured, unfilled epoxy-based encapsulant is approximately 80 ppm. A high encapsulant CTE can lead to catastrophic results when the assembly is subjected to high temperatures. Excess encapsulant expansion can cause mechanical failure of the solder joints 150, and may even fracture the die 200. It is for this reason that fillers have typically been added to encapsulant compositions, particularly in the field of underfill encapsulation. The inclusion of fillers serves to lower the CTE of the epoxy formulation, thereby reducing the risk of device failure from thermal changes. Underfill encapsulants, for example, typically have a filler loading of 50% to 70% by weight.

In the case of reflow encapsulants, however, 50% to 70% filler loading presents an additional problem. During reflow, the solder bumps 250 become fluid, raising the possibility that a large number of filler particles could enter the solder and remain trapped within the solder joints when cooled. This can prevent or impair the ability of the solder joints to form or conduct signals between the die 200 and substrate 100.

Through extensive testing, it has been further determined that merely decreasing the amount of filler in the encapsulant from the typical 50% to 70% range does not solve the problem. For example, 30% filler loading resulted in an unsatisfactory rise in CTE, leading to unsatisfactory cracking and crazing of the cured encapsulant when subjected to thermal and shock testing. Tests with 0% filler loading removed all risk of solder joint contamination, but also resulted in cracking and crazing when subjected to temperature stress testing. This testing indicates that filler loading at these levels creates an unacceptably high risk of device failure due to high encapsulant CTE, resulting in a high risk of device failure.

However, testing has revealed that a filler loading of 8% to 20% by weight allows proper solder joint formation, while also serving to lower the CTE of the encapsulant sufficiently to reduce the risk of encapsulant or solder joint failure during temperature stress testing. Cured reflowable encapsulants having 8% to 20% filler loading resulted in packages which showed no signs of weakening or fracturing after testing. More particularly, filler loadings of 15% by weight consistently resulted in structurally reliable packages while retaining solder joint integrity.

In a presently preferred embodiment, encapsulant 150 comprises a formulation of a resin having epoxy and flexibilisers (about 28% and about 15% by weight, respectively, for a total of about 43% by weight), hardener systems comprising epoxides and a cross-link agent of an acid anhydride (about 7% and about 35% by weight, respectively, for a total of about 42% by weight), a filler of an alumina (about 15% by weight), an organic salt catalyst (0.27% by weight), and a silane coupling agent (about 0.27% by weight). The resin forms a thermoset network structure and provides good surface adhesion. The filler improves the mechanical strength and CTE and helps to control viscosity as explained above. The cross-link agent(s) react with the resin to form a highly cross-linked network in the system having a hardening that controls the encapsulant's gel properties, and also serve as fluxing agents. The flexibiliser(s) generally improve thermal tolerances of encapsulant 150. The catalyst(s) accelerate the epoxy curing and help to control gel properties of encapsulant 150.

In a preferred embodiment, the inorganic filler material is composed of particles of spherical alumina. However, it should be recognized such filler materials may take odd-shaped or amorphous (non-spherical) shapes and may be made of any of a variety of electrically insulative inorganic materials including glass, silicon dioxide or aluminum. It should also be understood that a variety of reflow encapsulant compositions could be used with satisfactory results, providing the filler material is provided in 8% to 20% of the composition by weight, while remaining consistent with the spirit of the invention.

Alternately stated, a first contemplated embodiment of the invention includes an apparatus 500 having a substrate 100, an electrical device 200 configured to be mounted to the substrate by solder joints 250, and a reflow encapsulant 150. The reflow encapsulant 150 includes an inorganic filler material provided in an amount of 8% to 20% of the by weight for providing structural support to the connection between the substrate 100 and the electronic device 200, the reflow encapsulant 150 being configured to cure while the solder joints 250 are reflowed. The inorganic filler material may optionally be provided in an amount of 15% by weight. As a further option, the 20 adhesive may include an epoxy resin. As a further option, the inorganic filler material may be alumina. The inorganic filler material may optionally be in the form of spherical particles.

Alternately stated, a second contemplated embodiment of the invention includes a reflow encapsulant 150 having a curable adhesive, a fluxing system and inorganic filler material in an amount of 8–20% by weight. The inorganic filler material may optionally be provided in an amount of 15% by weight. As a further option, the adhesive may include an epoxy resin. As a further option, the inorganic filler material may be alumina. The inorganic filler material may optionally be in the form of spherical particles.

From the foregoing, it is apparent that the present invention is particularly suited to provide the benefits described above. While particular embodiments of the invention have been described herein, modifications to the embodiments which fall within the envisioned scope of the invention may suggest themselves to one of skill in the art who reads this disclosure. Therefore, the scope of the invention should be considered to be limited only by the following claims.

What is claimed is:

1. An apparatus, comprising:
   a substrate;
   an electrical device configured to be mounted to the substrate by solder joints; and
   a reflow encapsulant, comprising:
   inorganic filler material provided in an amount of 8% to 20% of the encapsulant by weight for providing structural support to the connection between the substrate and the electronic device, the reflow encapsulant being configured to cure while the solder joints are reflowed.

2. The apparatus of claim 1 in which the inorganic filler material is provided in an amount of about 15% by weight of the encapsulant.

3. The apparatus of claim 1 in which the encapsulant comprises an epoxy resin.

4. The apparatus of claim 1 in which the inorganic filler material comprises alumina.

5. The apparatus of claim 1 in which the inorganic filler material comprises spherical particles.

6. An apparatus comprising:
   a substrate including electrical conduits;
   an electronic device having electrical contacts configured to be connected to the electrical conduits; and
   a reflow encapsulant for structurally reinforcing the connection between the substrate and the electronic device, comprising:
   a curable adhesive;
   a fluxing system; and
   inorganic filler material provided in an amount of 8–20% by weight of the reflow encapsulant.

7. The apparatus of claim 6 in which the inorganic filler material is provided in an amount of about 15% by weight of the encapsulant.

8. The apparatus of claim 6 in which the adhesive comprises an epoxy resin.

9. The apparatus of claim 6, in which the inorganic filler material comprises alumina.

10. The apparatus of claim 6, in which the inorganic filler material comprises spherical particles.

* * * * *